United States Patent [19]

Hirao

[11] Patent Number: 4,661,166
[45] Date of Patent: Apr. 28, 1987

[54] METHOD OF MANUFACTURING SEMICONDUCTOR DEVICE USING A CZOCHRALSKI WAFER AND MULTIPLE HEAT TREATMENT

[75] Inventor: Tadashi Hirao, Itami, Japan

[73] Assignee: Mitsubishi Denki Kabushiki Kaisha, Tokyo, Japan

[21] Appl. No.: 652,464

[22] Filed: Sep. 20, 1984

[30] Foreign Application Priority Data

Dec. 21, 1983 [JP] Japan ................................ 58-243263

[51] Int. Cl.$^4$ .......................................... H01L 21/324
[52] U.S. Cl. .............................. 148/1.5; 148/DIG. 60; 148/DIG. 118; 29/576 T
[58] Field of Search ...... 29/576 T; 148/1.5, DIG. 60, 148/DIG. 118

[56]  References Cited

U.S. PATENT DOCUMENTS 3,997,368 12/1976 Petroff et al. .............. 148/DIG. 60

OTHER PUBLICATIONS

Hiromitsu Shiraki, "Stacking Fault Generation Suppression and Grown-In Defect Elimination in Dislocation Free Silicon Wafers by HCl Oxidation", Japanese Journal of Applied Physics, vol. 15, No. 1, Jan. 1976, pp. 1–10.
Ogino et al., "Two-Step Thermal Anneal and Its Application to a CCD Sensor and CMOS LSI", J. Electrochm. Soc.: Solid-State Science & Technology, Jun. 1983, pp. 1397–1402.
Arst, M. C. et al., "Increased Oxygen Precipitation in CZ Silicon Wafers Covered by Polysilicon" in J. Electronic Mat., vol. 13, No. 5, pp. 763–778., Sep. 1984.
Colclaser, R. A., Microelectronics: Processing and Device Design, John Wiley & Sons, 1980, pp. 92–95.
Nicollian, E. H., MOS (Metal Oxide Semiconductor) Physics and Technology, John Wiley & Sons, 1982, pp. 764–775.
Ghandi, S. K., VLSI Fabrication Principles, John Wiley & Sons, 1983, pp. 388–392.
Hu, S. M., "Precipitation of Oxygen in Silicon . . . " in J. Appl. Phys., 52(6), Jun. 1981, pp. 3974–3984.
Nagasawa, K. et al., "A New Intrinsic Gettering Technique . . . " in Appl. Phys. Lett. 37(7), Oct. 1980, pp. 622–624.
Tsuya, H. et al. "A Study on Intrinsic Gettering . . . " in J. Electrochem. Soc.: Solid-State Sci. and Tech. 129(2), Feb. 1982, pp. 374–379.
Yamamoto, K. et al. "Lifetime Improvement . . . by . . . Two-Step Annealing" in Appl. Phys. Lett. 36(3), Feb. 1980, pp. 195–197.

Primary Examiner—Brian E. Hearn
Assistant Examiner—Tuan Quach
Attorney, Agent, or Firm—Lowe Price LeBlanc Becker & Shur

[57]  ABSTRACT

The inventive method of manufacturing a semiconductor device is carried out by slicing a silicon single crystal grown by a Czochralski method, thereby to provide a wafer (1), annealing the wafer (1) at a temperature range of 600° C. to 800° C. in an atmosphere including an inert gas and a small amount of oxygen for approximately 2 to 6 hours, thereby to precipitate oxygen (2) in the whole wafer (1), and then annealing the wafer (1) in the temperature range of 1000° C. to 1100° C. in a water vapor atmosphere including chlorine, thereby to form an oxide film (3) on the surface of the wafer (1), whereby a denuded zone (4) is formed beneath the oxide film (3) while crystal defects (5a–5d, 6) serving as a getter of impurities such as metals are formed beneath the denuded zone.

In accordance with the inventive method, a denuded zone (4) having a controlled thickness can be formed in the wafer (1) without being influenced by the initial crystal defects and the oxygen concentration of the wafer.

5 Claims, 9 Drawing Figures

METHOD OF MANUFACTURING SEMICONDUCTOR DEVICE USING A CZOCHRALSKI WAFER AND MULTIPLE HEAT TREATMENT

BACKGROUND OF THE INVENTION

1. Field of the Invention

The present invention relates to a method of manufacturing a semiconductor device employing a wafer obtained by slicing a silicon single crystal grown by a Czochralski method. More specifically, the present invention relates to a method in which a denuded zone free from impurities of metal or the like and free of crystal defects is formed on the surface layer of a wafer, whereupon a semiconductor device is formed in the denuded zone.

2. Description of the Prior Art

A conventional method of forming a denuded zone in a surface layer of a silicon wafer comprises a heat treatment including from one to three steps utilizing oxygen precipitation. Such heat treatment methods are disclosed in, for example, "Intrinsic Gettering by Oxide Precipitate Induced Dislocations in Czochralski Si", by T.Y. Tan, App. Phys. Letters; vol. 30; No. 4; 1977, P. 175–P. 176; "A Study on Intrinsic Gettering in CZ Silicon Crystals: Evaluation, Thermal History Dependence, and Enhancement", by H. Tsuya et al., J. Electrochem. Soc., vol 129, No. 2, 1982, P. 374–P. 379; Japanese Patent Publication No. 52329/1983; Japanese Patent Publication No. 3375/1983; and Japanese Patent Laying Open Gazette No. 128037/1982.

In the following, the process of forming a denuded zone will be described by taking an example of a conventional method including two steps.

At the first step, a wafer is annealed at a relatively low temperature of 600° C. to 800° C. in an atmosphere of $N_2$ gas (generally, $N_2$ is used as an inert gas) for a long period of, time of say, 8 to 45 hours, whereby excessive interstitial oxygen elements $O_i$ are precipitated on the whole wafer. Then, in the second step, the wafer is annealed at the temperature of say 1000° C. an atmosphere of $N_2$ or $O_2$ gas. At the second step the oxygen $O_i$ is diffused outward in the wafer, whereby nuclei to become defects disappear, so that a denuded zone is formed, while crystal defects of high density are introduced inside from the denuded zone.

The denuded zone thus formed is utilized to form a semiconductor device of a high quality therein. The crystal defects of a high density in the inner layer also serve as a getter for metallic impurity, so that the function of the semiconductor is prevented from being degraded. The closer to the surface the inner crystal defects are (i.e.; the smaller the thickness of the denuded zone) the more effective is the gettering; however, if the inner crystal defects are formed to be too close to the surface, this increases the probability of the defects being even burning included in the device, thereby to adversely affect the device. Accordingly, it is important to control the thickness of the denuded zone and the density of the inner crystal defects serving as a getter.

However, in accordance with a conventional denuded zone forming method, the thickness of the denuded zone and the density of the inner crystal defects are influenced by an initial concentration of oxygen, existence of defects and the like in a silicon wafer. More specifically, even with a particular oxygen concentration, a denuded zone may be differently formed and, at times no denuded zone may be formed.

SUMMARY OF THE INVENTION

Accordingly, a principal object of the present invention is to provide a method of manufacturing a semiconductor device characterized by the step of forming a denuded zone layer of a desirably controlled thickness on a silicon wafer.

In accordance with this inventive method of manufacturing a semiconductor device, a wafer obtained by slicing a silicon single crystal grown by the Czochralski method is annealed at a temperature range of 600° C. to 800° C. in an atmosphere including an inert gas or a small amount of oxygen for approximately 2 to 6 hours, thereby to precipitate oxygen on the entire wafer. The wafer then annealed at a temperature range of 1000° C. to 1100° C. in a water vapor atmosphere including chlorine for more than one hour, so that an oxide film is formed on the surface of the wafer, whereby a denuded zone is formed beneath the oxide film while crystal defects serving as a getter of impurities such as metals are formed in an inner layer.

In accordance with this inventive method, a denuded zone of a controlled thickness can be formed without being influenced by the initial crystal defect density and oxygen concentration of a silicon wafer.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
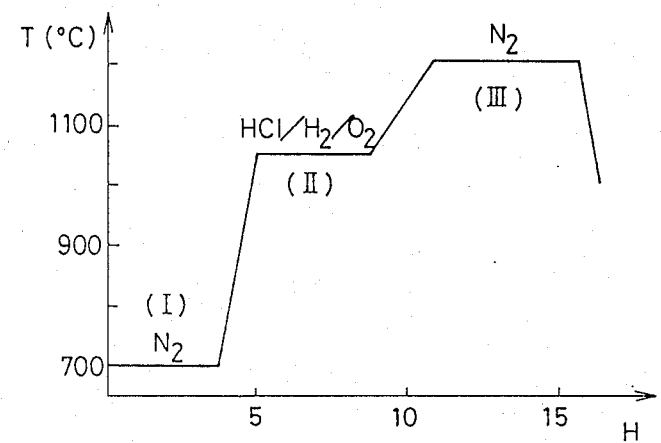
FIG. 1 is a diagram showing one example of heat treatment in accordance with a manufacturing method of the present invention.

FIG. 1 is a diagram schematically showing heat treatment in accordance with one embodiment of the present invention. Referring to this figure, the ordinate indicates the heat treatment temperature in degrees centigrade and the abscissa indicates treating time in hours.

Figure 2A:
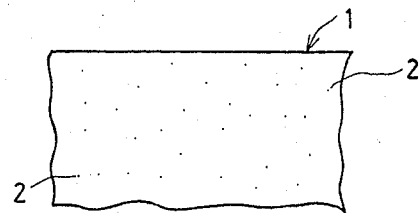
FIGS. 2A and 2B are views schematically showing sectional views of a silicon wafer at major manufacturing steps of one embodiment of a method of manufacturing semiconductor devices in accordance with the present invention.

At the first step I of the heat treatment, a wafer, including crystal defects as grown, is annealed at a relatively low temperature, say 700° C., in the atmosphere of an inert gas such as $N_2$ for more than 2 hours and preferably for approximately 4 hours. FIG. 2A is a partial sectional view schematically showing the internal structure of the wafer after the above described step I. As shown, Oi precipitates 2 are produced throughout this wafer 1 through this treatment at this step I.

Figure 2B:
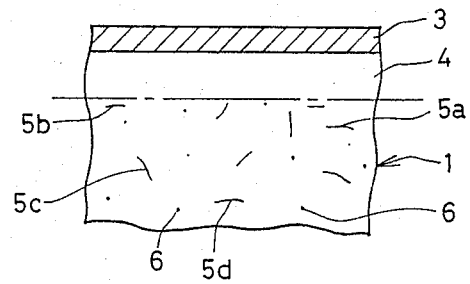

Then at the second step II, the wafer of the state as shown in FIG. 2A is subjected to oxidation (HCl - Wet oxidation) at a relatively high temperature, say 1050° C. and in a wet atmosphere including HCl. FIG. 2B is a sectional view showing schematically the inside of the wafer after the above described step II. As shown, an oxide film 3 is formed on the surface of the wafer 1, while a denuded zone layer 4 is formed beneath the oxide film 3. On the other hand, stacking faults 5a to 5d and dislocations 6 are formed through oxidation, with the Oi precipitates as nuclei, in the layer inboard of the above described denuded zone layer.

The third step III is an optional step and is described in detail subsequently. It is employed in cases where it is necessary to further increase the thickness of the denuded zone layer without increasing the thickness of the oxide film of the wafer as shown in FIG. 2B.

Figure 3:
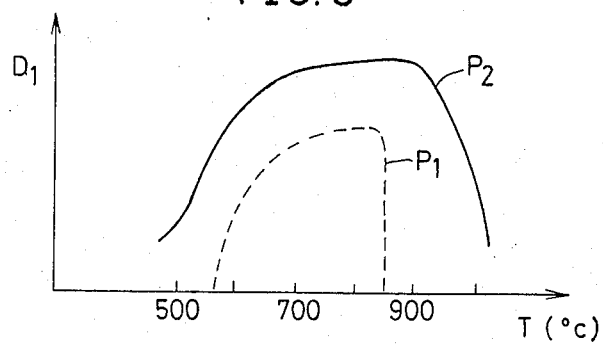
FIG. 3 is a diagram showing a relation of defect density $D_1$ with respect to the annealing temperature T at the first step of a relatively low temperature.

FIG. 3 is a diagram showing a relation between the annealing temperature T(° C.) and defect density $D_1$ in a relatively low temperature range in a prescribed treating time. In the figure, a dotted curve $P_1$ shows the density of the stacking faults and, as seen, a high value has been reached in the temperature range of 600° C. to 800° C. A solid curve $P_2$ shows dislocation density and, as seen, many dislocations have been generated in the temperature range of 600° C. to 900° C. Therefore, at the first step I for treatment at a relatively low temperature, stacking faults and dislocations were introduced positively at 700° C., for example. At the step I, $N_2$ gas was employed, although He gas or Ar gas may be used or $N_2$ gas including a small amount of $O_2$ gas may also be used.

Figure 4:
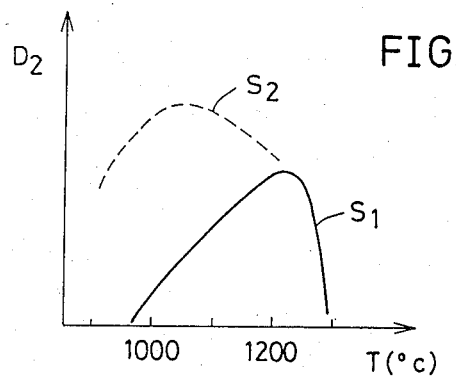
FIG. 4 is a diagram showing a relation of stacking fault density $D_2$ with respect to the annealing temperature T at the second step of a relatively high temperature.

FIG. 4 is a diagram showing a relation between an oxidizing heat treatment temperature T and the defect density $D_2$ in a relatively high temperature range in a predetermined treatment time. In this figure, this solid curve $S_1$ shows a result of treatment in a dry oxidizing atmosphere, while dotted curve $S_2$ shows the result in a wet oxidizing atmosphere. As seen, more stacking faults, labelled as 5a to 5d in FIG. 2B, have been generated in a wet atmosphere than in a dry atmosphere and the defect density shows a maximum at 1000° C. to 1100° C. The reason is that the stacking faults shrink at a high temperature and disappear, and this trend is more dominant in a dry atmosphere. Accordingly, in order that the defects serving as a getter may be fully introduced and a denuded zone layer may be obtained in the embodiment in discussion, a wet oxidizing atmosphere of 1150° C. is employed at the step II.

Figure 5:
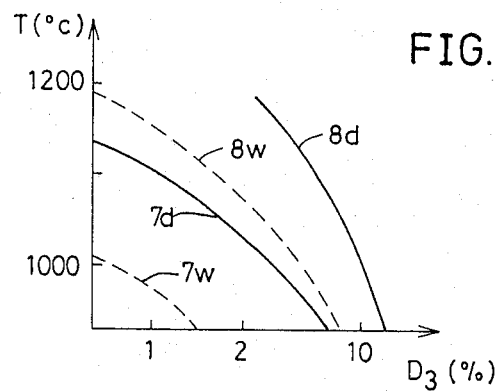
FIG. 5 is a diagram showing a change of a state of a wafer, with the HCl concentration $D_3$ and oxidizing temperature T as parameters.

FIG. 5 is a graph showing a change in a state of the wafer with the HCl density $D_3$ (%) and the oxidation temperature T (° C.) as parameters. The solid curves 7d and 8d are relate to the treatment in a dry oxidizing atmosphere, and the dotted curves 7w and 8w correspond to a wet atmosphere. In a dry oxidizing atmosphere, in the region right of or above the solid curve 8d the effect of HCl becomes excessive, giving rise to unevenness of the surface of the wafer. On the other hand, in the region surrounded by the curve 7d and the horizontal and vertical axes, unevenness of the surface of the wafer does not occur although no gettering effect is attained due to insufficient inner defects. The wafer processed in the region between the curves 7d and 8d does not give rise to unevenness of the surface and has a gettering effect.

The same applies to HCl- wet oxidation represented by the dotted line curve and it is only in the region defined by the curves 7d and 8d that the gettering effect is exhibited without giving rise to unevenness of the surface of the wafer. The region of a preferred condition in the above described wet oxidizing heat treatment resides in a region of a temperature lower than or the density of HCl lower than was the case with the dry treatment. Specifically, in the temperature range of 1000° C. to 1100° C., where stacking faults are likely to be generated within the wafer, gettering effect can be attained without causing unevenness of the surface of the wafer through wet oxidation of HCl of 1% to 60% concentration.

The thickness of the denuded zone layer is further increased as the HCl wet oxidation time is longer and the thickness of the oxide film is thicker; however, in order to attain an efficient gettering effect there exists an optimum thickness. In forming such devices as CMOS's, color image sensors, bipolar transistors (which necessitate annealing at a high temperature for fabrication thereof) on the denuded zone layer, the denuded zone layer is increased in the high temperature annealing and the oxide film 3 formed at the step II should be larger than approximately $0.5\mu m$ (requiring say, more than approximately one hour at 1050° C.). However, in forming devices such as NMOS s, which does not necessitate any high temperature annealing in the denuded zone layer, the oxide film 3 of approximately $1\mu m$ is formed at the step II, so that the denuded zone layer of a larger thickness should be introduced.

A mechanism for expediting formation of a denuded zone layer in HCl oxidation may be accounted for in the following manner. More specifically, HCl withdraws excessive oxygen Oi from the surface of the wafer, thereby preventing the generation of dislocations and stacking faults and, in addition, causes shrinkage and disappearance of the stacking faults. Accordingly, the closer to the surface the stacking faults inside the wafer are (say 5a, 5b in FIG. 2B), the smaller than they are relative to those in the center (say 5c, 5d in FIG. 2B).

Figure 6:
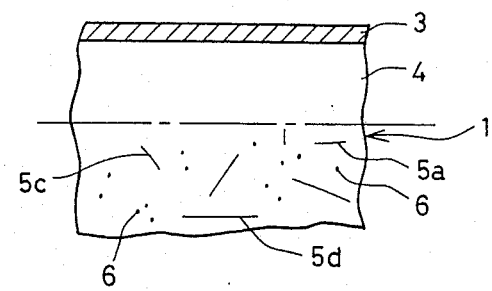
FIG. 6 is a partial schematic sectional view of a silicon wafer of another embodiment of the inventive method of manufacturing semiconductor devices.

FIG. 6 is a sectional view, schematically showing an internal structure of the silicon wafer in accordance with another embodiment of the present invention. In the embodiment in discussion, after a wafer of such a structure as shown in FIG. 2B is obtained in accordance with the steps I and II in FIG. 1, a treatment of an optional step III is applied in order to increase the thickness of the denuded zone layer without increasing the thickness of this oxide film 3. At the optional step, it is preferred that the oxide film not be thick in order to utilize the oxide film 3 in the subsequent device forming process and hence the step is advantageous in the case where an ample thickness of the denuded zone layer is to be obtained. At the above described optional step III, the wafer is annealed at a high temperature, say 1250° C. in an atmosphere of an inert gas such as $N_2$ gas for more than approximately four hours. As a result, the oxygen Oi is diffused outward from the surface of the wafer 1 and, as shown in FIG. 6, the thickness of the denuded zone layer can be further increased without increasing the thickness of the oxide film 3. In such a case, the stacking faults grow larger and more dislocations are generated.

Figure 7:
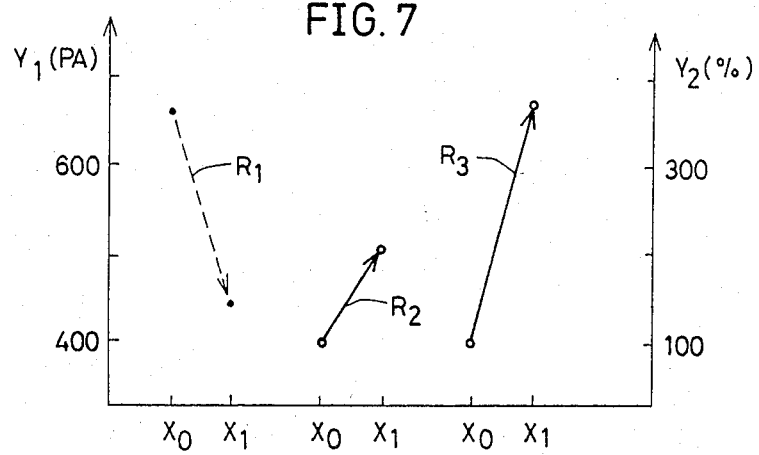
FIG. 7 is a diagram explaining the effect when the present invention is applied to an image sensor large scale integration.

FIG. 7 is a diagram showing one example of a comparison of an improvement in the characteristic and the yield rate of an image sensor large scale integration manufactured by employing a HCl- wet oxidation process in accordance with the present invention, as compared with one made by a conventional process without intrinsic gettering effect. The circle above the postion $X_O$ on the horizontal axis corresponds to a conventional large scale integration and the circle above the position $X_1$ corresponds to a large scale integration in accordance with the present invention. The left ordinate $Y_1$ shows a junction leak (PA) and the right ordinate 42 represents the yield rate (as %) attained by the present invention, with that of the conventional art being the criterion of 100%. The junction leak is represented by a solid circle, while the yield rate is shown by a open circle. The junction leak of the image sensor large scale integration in accordance with the present invention is decreased, as seen as a dotted line arrow symbol $R_1$, as compared with that of a conventional kind, whereby the yield rate of the wafer test has been improved as shown by the solid line arrow symbol $R_2$. A final test after completion of the image sensor large scale integration exhibits a large improvement as shown by the dotted line arrow symbol $R_3$.

Figure 8:
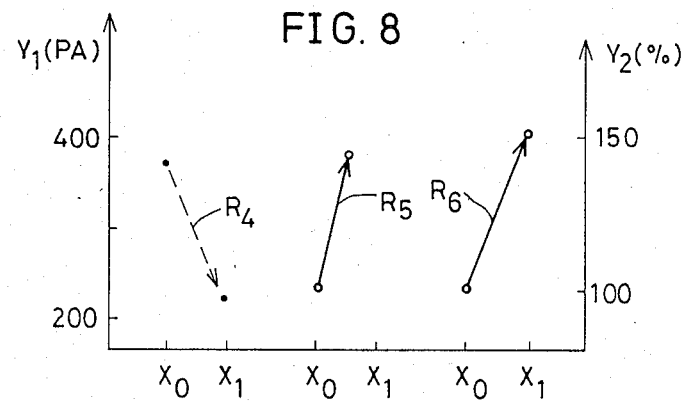
FIG. 8 is a diagram explaining the effect when the present invention is applied to a dynamic memory large scale integration.

FIG. 8 is a diagram similar to that of FIG. 7 and shows one example of a comparison of the improvement in the characteristic and the yield rate of a dynamic memory large scale integration manufactured in accordance with the present invention, as compared with those of the conventional kind. In accordance with the present invention, the junction leak is decreased as shown by the dotted line arrow symbol $R_4$ and the yield rate after the test concerning a refresh time is improved as shown by the solid line arrow symbol $R_5$ and the yield rate after the wafer test is improved as shown by the solid line arrow symbol $R_6$.

Although the present invention has been described and illustrated in detail, it should be clearly understood that the same is by way of illustration and example only and is not to be taken by way of limitation, the spirit and scope of the present invention being limited only by the terms of the appended claims.

What is claimed is:

1. A method of manufacturing a semiconductor device, said method comprising the steps of:
    preparing a wafer obtained by slicing a silicon monocrystal grown by a Czonchralski method, said wafer including some number of crystal defects and oxygens;
    a first heat treatment, including the step of annealing said wafer in the temperature range of 600° C. to 800° C. in an atmosphere of an inert gas or an inert gas including a very small amount of oxygen for more than two hours, thereby to precipitate oxygen in said wafer; and
    a second heat treatment after said first heat treatment, including oxidation of said wafer in the temperature range of 1000° C. to 1100° C. in an atmosphere of a water vapor including chlorine for more than one hour, with an oxide film being formed on the surface of said wafer and a denuded zone being formed beneath said oxide film with said crystal defects serving as an intrinsic getter being retained in an inner layer.

2. A method of manufacturing a semiconductor device, said method comprising the steps of:
    preparing a wafer obtained by slicing a silicon monocrystal grown by a Czochralski method, said wafer including some number of crystal defects and oxygen:
    a first heat treatment, including the step of annealing said wafer in the temperature range of 600° C. to 800° C. in an atmosphere of an inert gas or an inert gas including a very small amount of oxygen for more than two hours, thereby to precipitate oxygen in said wafer;
    a second heat treatment after said first heat treatment, including an oxidation of said wafer in the temperature range of 1000° C. to 1100° C. in an atmosphere of a water vapor including chlorine for more than one hour, with an oxide film being formed on the surface of said wafer and a denuded zone being formed beneath said oxide film with said crystal defects serving as an intrinsic getter being retained in an inner layer; and
    a third heat treatment after said first and second heat treatments, including annealing said wafer in the temperature range of 1150° C. to 1250° C. in an atmosphere of an inert gas for more than four hours, whereby the thickness of the denuded zone is increased without increasing the thickness of said oxide film.

3. A method in accordance with claim 1, wherein the gas providing the atmosphere for said first heat treatment is selected from the group consisting of $N_2$, He, Ar and the same including a small amount of oxygen.

4. A method in accordance with claim 1:
    said chlorine in said atmosphere for said second heat treatment is provided in the form of HCl.

5. A method in accordance with claim 2, wherein:
    said atmosphere gas for said third heat treatment is selected from the group consisting of $N_2$, He and Ar.

* * * * *